(12) United States Patent
Ostertun et al.

(10) Patent No.: US 12,040,034 B2
(45) Date of Patent: Jul. 16, 2024

(54) METHOD TO INCREASE THE USABLE WORD WIDTH OF A MEMORY PROVIDING AN ERROR CORRECTION SCHEME

(71) Applicant: NXP B.V., Eindhoven (NL)

(72) Inventors: Soenke Ostertun, Wedel (DE); Björn Fay, Brande-Hörnerkirchen (DE); Vitaly Ocheretny, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/313,669

(22) Filed: May 8, 2023

(65) Prior Publication Data

US 2023/0274787 A1    Aug. 31, 2023

Related U.S. Application Data

(62) Division of application No. 17/477,871, filed on Sep. 17, 2021, now Pat. No. 11,694,761.

(51) Int. Cl.
*G11C 29/42* (2006.01)
*G06F 11/10* (2006.01)

(52) U.S. Cl.
CPC .......... *G11C 29/42* (2013.01); *G06F 11/1056* (2013.01); *G06F 11/1068* (2013.01); *G06F 11/1096* (2013.01)

(58) Field of Classification Search
None
See application file for complete search history.

(56) References Cited

U.S. PATENT DOCUMENTS

| | | | | |
|---|---|---|---|---|
| 4,524,445 A * | 6/1985 | Fujii | ...................... | H04L 7/048 375/359 |
| 4,785,452 A * | 11/1988 | Petz | .................... | G06F 11/1012 714/E11.042 |
| 5,099,484 A * | 3/1992 | Smelser | .............. | H03M 13/151 714/E11.043 |
| 6,901,552 B1 * | 5/2005 | Fey | ..................... | G06F 11/1008 714/800 |
| 7,191,388 B1 * | 3/2007 | Yuan | ................... | H03M 13/096 714/801 |
| 7,278,085 B1 * | 10/2007 | Weng | .................... | G11C 7/1006 714/766 |
| 10,892,777 B2 * | 1/2021 | Wang | ................ | H03M 13/1575 |
| 11,500,719 B1 * | 11/2022 | Srinivasan | .......... | G06F 11/1048 |
| 2001/0037484 A1 * | 11/2001 | Paterson | ............... | H03M 13/09 714/784 |

(Continued)

OTHER PUBLICATIONS

T. Fichna, M. Gartner, F. Gliem and F. Rombeck, "Fault-tolerance of spaceborne semiconductor mass memories," Digest of Papers. Twenty-Eighth Annual International Symposium on Fault-Tolerant Computing (Cat. No.98CB36224), Munich, Germany, 1998, pp. 408-413, (Year: 1998).*

*Primary Examiner* — Daniel F. McMahon (57) ABSTRACT

Various embodiments relate to a method for storing and reading data from a memory. Data words stored in the memory may be grouped, and word specific parity information and shared parity information is generated, and the shared parity information is distributed among the group of words. During reading of a word, if more errors are detected than can be corrected with word parity data, the shared parity data is retrieved and used to make the error corrections.

15 Claims, 2 Drawing Sheets

(56) References Cited

U.S. PATENT DOCUMENTS

| | | | |
|---|---|---|---|
| 2006/0168494 A1* | 7/2006 | Trainin | H03M 13/2942 |
| | | | 714/758 |
| 2007/0174753 A1* | 7/2007 | Sonnekalb | G06F 11/1068 |
| | | | 714/E11.038 |
| 2009/0210774 A1* | 8/2009 | Godard | G06F 11/1068 |
| | | | 714/801 |
| 2012/0266041 A1* | 10/2012 | Wang | G11C 29/848 |
| | | | 714/752 |
| 2013/0139028 A1* | 5/2013 | Goel | H03M 13/1575 |
| | | | 714/753 |
| 2016/0342467 A1* | 11/2016 | Kumar | G11C 29/52 |
| 2017/0257120 A1* | 9/2017 | Kern | G06F 11/1076 |
| 2019/0146873 A1* | 5/2019 | Wu | G06F 11/1048 |
| | | | 714/764 |
| 2019/0188077 A1* | 6/2019 | Kwon | G06F 11/1072 |
| 2020/0097361 A1* | 3/2020 | Suh | G06F 11/1048 |

\* cited by examiner

FIG. 1

FIG. 2

# METHOD TO INCREASE THE USABLE WORD WIDTH OF A MEMORY PROVIDING AN ERROR CORRECTION SCHEME

CROSS-REFERENCE TO RELATED APPLICATIONS

This application claims priority under 35 U.S.C. § 119 to U.S. patent application Ser. No. 17/477,871, filed on Sep. 17, 2021, the contents of which are incorporated by reference herein.

TECHNICAL FIELD

Various exemplary embodiments disclosed herein relate generally to method to increase the usable word width of a memory providing an error correction scheme.

BACKGROUND

Memories frequently use error correction schemes by adding several parity bits to the payload data word to increase reliability. These parity bits may then be used to detect errors and in certain situations to correct for those errors. This allows for the data stored in the memory to be reliably stored.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a method for storing data in a memory, including: for each of group of G data words, where G is an integer: determining parity information that may be used to detect up to 2t bit errors in the data word and correct up to t bit errors in the data word, where t is an integer; splitting the parity information into word parity information and split parity information, wherein the word parity information may be used to detect or detect and correct errors in the data word; combining the split parity information of each of the G data words into combined parity information; distribute the combined parity information into G sets of distributed parity bits; associating each of the G sets of distributed parity bits with a different one of the data words of the group of G data words; and storing each of the G data words along with its related word parity information and distributed parity bits.

Various embodiments are described, wherein word parity information includes an error detection bit and error correction bits.

Various embodiments are described, wherein combining the split parity information for each of the G data words into combined parity information includes XORing the split parity information for each of the G data words.

Further various embodiments relate to a method for storing data in a memory that stores a group of G data words with w data-bits per data word, including: generating a first generator polynomial g(x); for each of the plurality of G data words: generating the first parity bits of the data word, wherein the first parity bits are the coefficients of a polynomial p(x) and wherein the polynomial is based upon a polynomial a(x) and the polynomial g(x), wherein a(x) is a binary polynomial with the coefficients being the data bits of the data word; generating first split parity bits of the data word based upon p(x); and generating second split parity bits of the data word based upon the first parity bits and p(x); combining the second parity bits for each word into Q; distributing the bits of Q among the G data words; and storing the G data words in the memory, wherein each data word includes a(x), first parity bits, and distributed bits of Q.

Various embodiments are described, further including encoding Q into additional parity bits P; and distributing the bits of P among the G data words, wherein storing the G data words in the memory, includes the distributed bits of P.

Various embodiments are described, further including determining a parity bit B for Q and P, where B is distributed with the bits of Q and P among the G data words.

Various embodiments are described, further including determining extra parity information for each of the G data words based upon the data word and its associated parity information and wherein storing the G data words in the memory includes storing the extra parity information with the respective data word.

Various embodiments are described, wherein $g(x) = \text{lcm}(m_1(x), \ldots, m_{\delta-1}(x))$, where $m_i$ is the minimal polynomial of $\alpha^i$ and $\alpha$ a primitive element in $GF(2^m)$, $\delta = 2 \cdot t + 1$, and t is the maximum number of correctable bit-errors in the group of G words, where $GF(2^m)$ is a finite field with $2^m$ elements where m is an integer.

Various embodiments are described, wherein $p(x) = a(x) \cdot x^{n-k} \mod g(x)$, where n is the code length and k is n minus the degree of the polynomial g(x).

Various embodiments are described, further including: generating a second generator polynomial g'(x) that is based upon the first generator polynomial g(x) with a lesser degree; wherein generating first split parity bits p'(x) of the data word is further based upon g'(x) wherein generating second split parity bits q(x) of the data word is further based upon g'(x).

Various embodiments are described, wherein $p'(x) = p(x) \mod g'(x) = a(x) \cdot x^{n-k} \mod g'(x)$, where $g'(x) = \text{lcm}(m_1(x), \ldots, m_{\delta'-1}(x))$, where $\delta' = 2 \cdot t' + 1$ and $t' \geq \lfloor t/2 \rfloor$.

Various embodiments are described, wherein $q(x) = (p(x) - p'(x))/g'(x)$.

Various embodiments are described, wherein combining q(x) for each word into Q includes XORing q(x) for each word into Q.

Various embodiments are described, further including: generating a second generator polynomial g'(x) that is based upon the first generator polynomial g(x) with a lesser degree; wherein generating first split parity bits p'(x) of the data word is calculated as $p'(x) = pH(x) \cdot x^u \mod g'(x) + pL(x)$, where $p(x) = pH(x) \cdot x^u + pL(x)$, with $u = \deg(g')$, and wherein the second split parity bits are pH(x).

Various embodiments are described, wherein when t'=1, the first split parity bits result in a Hamming code if only one of the first split parity bits and the second split parity bits are available, where t' is the maximum number of errors that may be corrected by only using the first split parity bits.

Further various embodiments relate to a method for reading data stored in a memory with parity information shared across G data words, including: reading a first data word including data bits, a word parity information, and a distributed parity information; checking the word parity information based upon the read data bits of the first word; when checking the word parity information indicates more errors than could be corrected with the word parity information then for each of a second through G data words:

reading the data word including data bits, a word parity information, and distributed parity information; determining a third parity information for the first word including combining the distributed parity information of each of the second to G data words; determining a fourth parity information based upon the data bits of the read second to G data words; and calculating the third parity information based upon the fourth parity information and the combined distributed parity information of each of the second to G data words; and correcting the read data bits of the first word based upon the third parity information.

Various embodiments are described, wherein the word parity information of each of G data words includes a single error detection bit.

Various embodiments are described, wherein the word information of each of the G data words includes a single error detection bit and a plurality of error correction bits.

Various embodiments are described, wherein calculating the third parity information based upon the fourth parity information and the combined distributed parity information of each of the second to G data words includes XORing the fourth parity information and the combined distributed parity information of each of the second to G data words.

Various embodiments are described, further including rereading the first data word after reading the second to G data words and determining if the reread first word is different from the read first data word.

Further various embodiments relate to a method for reading data stored in a memory that stores a group of G data words with w data bits per data word, including: generating a first generator polynomial g(x); generating a second generator polynomial g'(x) that is based upon the first generator polynomial g(x) with a lesser degree; reading a first word of the group of G data words including w data bits, first split parity bits p'(x), and a first portion of parity information Q; checking the first split parity bits p'(x) based upon the read data bits of the first word of the group of G data words; when checking the first parity information indicates more errors than could be corrected with the first parity information: reading second to G data words including of the group of G data words including w data bits, first split parity bits p'(x), and remaining portions of parity information Q; calculating Q by combining the portions of parity information Q from each of the G data words; generating second split parity bits q(x) of the first data word based upon Q and the 2 through G second split parity bits q(x) from each of the G data words; reconstructing the first parity bits p(x) of the first word of the group of G data words based upon q(x), g'(x), and p'(x) of the first data word of the group of G data words; and correcting the first word of the group of G data words based upon the first parity bits p(x).

Various embodiments are described, wherein $g(x)=\text{lcm}(m_1(x), \ldots, m_{\delta-1}(x))$, where $m_i$ is the minimal polynomial of $\alpha^i$ and $\alpha$ a primitive element in $GF(2^m)$, $\delta=2\cdot t+1$, and t is the number of bit-errors in the group of G words.

Various embodiments are described, wherein $g'(x)=\text{lcm}(m_1(x), \ldots, m_{\delta'-1}(x))$, where $\delta'=2\cdot t'+1$ and $t'\geq \lfloor t/2 \rfloor$.

Various embodiments are described, wherein generating second split parity bits q(x) of the first data word based upon Q and the 2 through G second split parity bits q(x) from each of the G data words includes XORing Q and the 2 through G second split parity bits q(x) from each of the G data words.

Various embodiments are described, further including rereading the first word after reading the second to G data words and determining if the reread first word is different from the read first word.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Data in systems like microprocessors are usually processed in words which consist of n bits (where n is usually but not necessarily a power of 2)—the data can be program code of a CPU (central processing unit) or data. The bits being processed are called payload in this disclosure.

In addition to the payload, additional data bits are frequently needed to store meta information (e.g., access rights, integrity protection in secure systems, etc.) When storing data in memories, such additional meta data usually must be stored and retrieved together with the payload data, i.e., at the same memory address. Consequently, the memory capacity needs to increase with the meta data impacting chip area and power consumption. One common use of such meta data is error detection and correction, which will be separately addressed herein from other (optional) meta data.

Embodiments of a coding method are described that distributes the parity bits over several words, such that less parity bits per word are needed, but still only a single word needs to be read to detect errors. The parity bits may include error detection bits and/or error correction bits. As long as no errors occur, there is no performance drop compared to standard error correction per word. This results in the area benefit of distributing parity bits over multiple words and while keeping the same error correction properties, but without the usual performance drop.

Memories often provide additional physical bits to protect the payload data against bit flips which may occur on very low but non-zero probability. Common schemes are the well-known Hamming encoding, CRC, and BCH codes as well as Reed-Solomon codes. Depending on the number of additional parity bits, these codes can detect and/or correct bit flips. As an example—a payload of 128 bits requires:

1 parity bit to allow for single-bit detection;
8 parity bits to allow for single-bit-correction;

9 parity bits to allow for single-bit-correction and double-bit detection;

16 parity bits to allow for double-bit-correction; and 17 parity bits to allow for double-bit-correction and triple-bit detection.

This illustrates that detection adds fewer extra bits than correction as a correction needs to identify the faulty bit(s). In general this comes from the fact that to detect t errors, a code needs minimum distance t+1 and to correct t errors it needs minimum distance 2t+1. Minimum distance is the minimal number of bits that differ between different code words. Another effect is that with a code having an odd minimum distance 2t+1, which can correct t errors, a code with minimum distance 2t+2 may be obtained by simply adding a "normal" parity bit and hence can detect one additional error.

Codes may protect more bits than needed for the specific application—e.g., 7 parity bits are not sufficient to correct all possible 1-bit-errors of a 128+7 bit wide word. But with 8 parity bits a Hamming code can ensure single-bit-correction of up to 247 payload bits (2^8=256 possible syndromes, 1 syndrome corresponding to all-correct, 8 syndromes corresponding to a bit flip of the parity bits themselves). The remaining "unused" bits are sometimes used for additional meta data.

Reliability considerations define how many bits per word or multi-word must be correctable. The probability of a chip failure reduces significantly with the number of correctable bits per word or multi-word. To meet a specific quality target, it may be required to be able to correct e.g., 1 bit per word. If the bit failure rate is too high to meet the quality target with single-bit-correction, a step to double-bit-correction can often resolve the issue. The reduction in failure rate by stepping up one bit in correction-capability can easily be more than needed.

In summary, specific codes provide margin in terms of how many payload bits can be covered and the correction capability per word can provide margin in terms of reliability needs.

The embodiments described herein provide a method to distribute the parity bits over several words, such that fewer parity bits per word are needed, but still only a single word needs to be read to detect errors. As long as at most 1 error occurs, there is no performance drop compared to standard error correction per word. So the memory gets the area benefit of distributing parity bits over multiple words and keeps the same error correction properties, but without the usual performance drop.

A first straight forward implementation would be to, e.g., combine 2 words to a group and run the error-correction on the group of 2. As an example—if a memory provides 128 payload+8 parity bits to ensure single-bit-correction within such a word of 136 bits, then grouping 2 words provides 256 payload bits and hence 9 parity bits are needed to correct a single-bit-error within 2 words, which are 265 bits in total. Hence, 133 bits per word are only needed instead of 136. The disadvantage of such an approach is that any read access to the memory needs to access both words. Consequently, the access times doubles and also the consumed energy is doubled, unless a caching scheme can benefit from the additional read access. In any case, a random read access will suffer from doubled latency. Also one bit remains unused.

The embodiments described herein provide a method to make parity bits available without the penalty on read access speed for most cases. This is achieved by maintaining reliable error detection at the word level (up to the number of expected errors, which also are to be corrected) and error-correction (occurring only occasionally on low probability) within a group of words. Reading of all the words of the group is then only needed if more than the number of expected errors is detected. The impact on system performance becomes very limited by this approach. For multiple errors one could even chose to correct up to a desired number of errors per word and only read the complete group if more than this desired number of errors occurs.

Grouping of a few words to larger entities leads to fewer parity bits per word as described above. This makes the error-correction-capability a bit worse (error correction of t errors in a multi-word group instead of in a single word). This is typically acceptable from reliability point of view.

The straight forward implementation described above does not consider the behavior of a single word of a such a group; it simply expands the amount of bits belonging to the code space by, e.g., a factor of 2 or 4. In the example given above, the number of parity bits increased from 8 to 9 to compensate the doubled size of the entity. Similarly 4 words could be grouped using 10 parity bits.

The encoding methods described herein split the parity bits differently. An extension of the code to more parity bits than required appears to be counter-productive. But the encoding method provides the means needed to obtain the desired behavior of a single-word read access.

In a first example implementation, a memory providing 136 bits per words meant to be used for 128 payload and 8 parity bits is provided. This ensures a single-bit-correction capability per word. Combining two words would require 9 parity bits to correct 1 bit within the 2 words. To judge, if a correction is needed and to actually do the correction, all payload, meta data, and parity bits need to be read from the memory. This encoding method does not extend the Hamming code as usual. Instead, the Hamming code gets extended only with respect to the scope of a single word. Sticking to the initial scheme of 128 payload+8 parity bits, the encoding gets expanded by 1 extra parity bit per word. This single extra bit shall contain an extra parity information of the payload data only to judge, if a correction is needed, i.e., a correctable error is supposed to have occurred. So, actually the parity of a single word gets extended to 9 parity bits (with different usage).

Within this example, two words result in 2×9 bits of parity. The newly introduced extra parity bit must be stored in the word it belongs to. The remaining 2×8 bits may be binary XORed resulting in only 8 bits. These 8 bits be distributed across the 2 words of the group—e.g., 4 bits will be stored per word. So, in total each word now includes 128 payload bits, 1 extra parity bit, and 4 shared parity bits. The 3 remaining bits may be used to store meta information next to the word or be removed to save area. Please note that the extra single parity bit only contains the parity information of the payload, but not for the 4 shared parity bits. In this case this could also be changed to also detect errors in the shared parity bits, but it does not increase reliability of the payload data and also is more complex to implement as well as not being so easy to generalize for multiple error correction.

In summary, the word includes 128 payload+1 error-detection-bit+4 shared parity bits for correction purpose. The error-detection bit does not need to cover the 4 shared parity bits and the 4 shared parity bits only need to cover the 128 payload bits. When reading a single word of such a group, the introduced error-detection-bit will indicate if any of the 128 payload+1 error-detection-bits flipped. If not, the data can be considered OK. A bit-error within the shared parity does no harm.

If a single-bit-error is detected, it needs to get corrected. In this case the other word needs to be read. It can be assumed, that all bits of this word are correct, as the correction-capability shall only cover one bit in a group of 2 words (also this assumption could be double-checked with the second word's parity bit). Hence, the full parity information of the second word can be re-calculated. After the two memory accesses also the stored binary XORed shared parity is available. From this the parity needed to correct the first word can be retrieved. When the words are written to the memory, the 8-bit-parity of word 0 was P0, the 8-bit-parity of word was P1, and the shared parity PS=P0^P1 was stored in the memory. When reading (with an error in word 0), PS gets read correctly, and P1 is calculated correctly. Hence the expected P0 can be calculated by PS^P1 and XORed with the re-calculated parity of the read access of word 0 to compute the syndrome of word 0. This syndrome allows for the correction of the faulty bit of word 0. Symmetrically, a bit flip in word 1 can get corrected in a similar manner.

Similar to the above example, four words could be grouped with 128 payload bits, 1 error-detection bit, and 2 shared parity bits, resulting in a total of 131 bits per word. The 8-bit-wide shared parity PS is again a bitwise XOR of the word-individual parity values.

The encoding method is not limited to an error correction scheme providing single-bit-correction. Similarly, it may get expanded to higher levels.

In a second example implementation, a memory providing 144 bits per words is meant to be used for a 128 payload and 16 parity bits. This ensures two-bit-correction capability per word using a corresponding BCH code. Double-bit-correction is again expected to happen very rarely, and a readout of a few words is acceptable when a double-bit-correction is needed. But single-bit-correction should be doable on word level to maintain the performance of the memory read even when a single bit is flipped. Single-bit-correction within a word of this size needs 8 parity bits. To also provide double-bit-detection, an additional 8-bit wide parity is needed at the word level with an additional bit to detected two errors in the word. Assume in this example, 4 words get grouped; this means that the 8 additional bits for each word may be XORed together resulting in 8 shared bits, which may be split into to 2 bit portions (i.e., 8 shared bits/4 words=2 bits shared per word) added to each of the words. The original 8 bits (to correct a single bit) together with the shared 8 parity extension may serve to correct a double-bit-failure within a word (see below for more details of the actual code). If two errors occur in different words of a group, they can already be corrected on word level. Please note that in this case the extra single parity bit is computed over the payload and 8-bit word parity (like an extended Hamming code), but not over the shared parity bits.

In this second example, the extra single bit may be saved and resulting in only 8-bits of parity per word plus the 2 bit shared parity. But then double-bit error could not be detected anymore at the word level, but reading of the complete group is needed. For this approach 2 cases need to be distinguished: errors are only detected in one word of a group, which means that the shared parity needs to be reconstructed and the encoding method tries to correct up to two errors in this one word. The other case would be that errors are detected in two words. Then it may be assumed that there are single errors in each word and that they may be corrected word by word, using only the word parity for each word.

Another option for this case is to actually use the word parity to also detect multiple transient errors, which might indicate a fault attack. In this case the erroneous word should be read again after having read the rest of the group to see if it was an transient (multi-bit) error or a static error (would read the same value again, or just with few bits changed if unstable bits are present).

To even further improve fault detection, the address of the word could be included in the parity computation of each word, such that faults in the address logic also could be detected.

Before the next example is described, how to construct such a (BCH) code will be described that may correct one error with only the first 8 bit of the parity bits, but still correct two errors if all 16 parity bits are read. This is not a usual property of BCH codes. But using the example the BCH code with generator $g=x^{16}+x^{14}+x^{13}+x^{11}+x^{10}+x^9+x^8+x^6+x^5+x+1$, the 16 parity bits may simply be split into the 8 MSBs and 8 LSBs. Each of these 8-bit chunks takes 165 different values, such that they may be used to form a single error correcting code for words up to 165−8=157 bits, which is a lot larger than the needed 128 data bits. So the full 255-bit BCH code may be punctured at some "data positions" to get unique values for the chosen half of the 16 parity bits.

How to construct such BCH codes will now be described because this split of parity bits is normally not supported. In the first sub-case, where there is only 8+1 parity bits per word, a similar split may be done as for the last case. Using a BCH code with generator $g=x^{24}+x^{23}+x^{21}+x^{20}+x^{19}+x^{17}+x^{16}+x^{15}+x^{13}+x^8+x^7+x^5+x^4+x^2+1$, the coding method may split the parity bits into 3×8 bits and select one of the three chunks. For each of these 3 chunks there are at least 164 different values (for the middle one even 166), such that the 128 data bits may be protected.

For the second sub-case a different construction is needed. The generator g will be factored into g1*g2 with $g1=x^{16}+x^{14}+x^{13}+x^{11}+x^{10}+x^9+x^8+x^6+x^5+x+1$ (from above) and $g2=x^8+x^7+x^6+x^5+x^4+x+1$. First the coding method computes per word p24=data*$x^{24}$ mod g, the usual BCH parity bits. Then the coding method splits p24 into p8*$x^{16}$+p16, where p8 corresponds to the 8 MSBs and p16 the 16 LSBs. The coding method computes q16=p24 mod g1=p8*$x^{16}$ mod g1+p16 per word. Per word q16 is stored, such that a usual 2 error correcting BCH code per word is obtained. The p8 values get XORed and stored as shared bits. For reconstruction the following cases need to be distinguished. If there are only 1 or 2 errors per word, which cannot be detected, the coding method will simply correct the word using only q16. If there are 3 errors per word, it may be assumed that there are not any other errors in the group and hence the full 24 bit parities for the other words may be computed, and their p8 values may be XORed together with the shared parity bits to recompute the p8 value for the wrong word. This is error free so the coding method may compute further p16'=q16'+p8*$x^{16}$ mod g1 and get p24'=p8*$x^{16}$+p16', which is the original p24 plus the bit errors from q16' (kept at the same positions). So now the complete word plus 24 (original) BCH parity bits and 3 bit errors have been determined, which the coding method may correct using standard BCH decoding techniques.

In a third example implementation a memory providing 160 bits per words meant to be used for 128 payload and 32 parity bits. This ensures a 4-bit-correction capability per word using a corresponding BCH code. In this example, 2×8 parity bits are needed to detect up to 4 errors per word. An extra parity bit is again needed to distinguish odd and even number of errors and hence enabling single bit error correction with only reading one word. The implementation is similar as above: The BCH code with 2×8 parity bits has minimum distance of 5, and with the extra parity bit results in a minimum distance of 6. So if 2, 3, or 4 errors occur, there is still a Hamming distance of at least 2 to the next code word, which may be detected (Hamming distance >1). Actually, the plain BCH code may be used with only 2×8 parity bits (with minimum distance 5) and check for a Hamming distance of 1. If the Hamming distance is 1, the single parity bit is checked, which also needs to be 1, otherwise it may indicate 4 errors.

As above, various cases need to be distinguished if more than one error has occurred in a word (i.e., the complete group needs to be read otherwise simply correct single error by using 2×8-bit word-parity).

In a first case, for an even number of bit errors in one word, 2 or 4 errors cannot be distinguished, so the coding method does not know if all 4 errors were in the word plus word parity or only 2 errors and the other 2 errors in the shared parity. For this an extended Hamming code needs to be added to the shared parity. If there are 2 errors in the shared parity, then there are only 2 errors in the word and its parity, so it may be corrected using only the word parity. If there are no errors in the shared parity, it may be used to reconstruct the "original full" BCH parity and correct the 4 errors in the word.

In a second case, for an even number of bit errors in two words, each word has two errors and can be corrected on their own.

In a third case, for an odd number of errors in one word, it actually means 3 errors, because a single error would already have been corrected. There might be an additional error in the shared parity, which could be detected and corrected. Then the "original full" BCH parity is reconstructed and the 3 errors in the word are corrected.

In fourth case, for an odd number of errors in two words, one word has a single error, and this error may be corrected first. Then proceed as above as in the second case.

In a fifth case, for an odd number of errors in more than two words, there can only be single bit errors per word, and hence these may be corrected.

In a sixth case, for an even and odd number of errors, the odd ones have to be single errors and the even one a 2-bit error, and hence, all the errors may be corrected with word parity only.

Again, a similar BCH code construction is needed as above for the second case, but now using 32 bits that are split into 2×16. Further, an additional extended Hamming code is needed for the shared parity, which results in 128+16+1+(16+5+1)/4=128+23 bits per word instead of 128+32.

From these examples a generic coding approach may be constructed. BCH codes are used, because they are the most often used and also most efficient codes for such use cases. Similar constructions could be made with different codes, such as for example Reed-Solomon codes, but would be less efficient.

The setup and some abbreviations will first be defined. There is a memory that stores w data-bits per word (typically a power of two), and it is assumed that there at most t bit-errors in a group of G words. For performance reasons, reading the complete group of words before it is decided if a word was correct or not is to be avoided, and sometimes it is desirable to be able to already correct s<t errors (usually just one) directly in a word. As a building block, truncated binary (n, k, d) BCH-codes will be used with a minimum distance $d \geq \delta = 2 \cdot t+1$, the designed minimum distance and $n < 2^m$, where $m = \lceil \log_2(n+1) \rceil$ is the smallest such number. Further, k is n minus the degree of the polynomial g(x). The generator polynomial is $$g(x) = lcm(m_1(x), \ldots, m_{\delta-1}(x))$$

with $m_i$ the minimal polynomial of $\alpha^i$ and $\alpha$ a primitive element in $GF(2^m)$. Note that $deg(m_i) \leq m$ and $deg(g) \leq t \cdot m$. Systematic encoding will be used: a bit-string a will be interpreted as a binary polynomial a(x) with the coefficients being the data bits and the parity bits will be the coefficients of $p(x) = a(x) \cdot x^{n-k} \mod g(x) \cdot t' \geq \lfloor t/2 \rfloor \delta' = 2 \cdot t' + 1$ Splitting of the parity bits in two parts is done by setting/selecting (which is needed in the specific case but not in general) and as well as $t' \geq \lfloor t/2 \rfloor \delta' = 2 \cdot t' + 1$ $g'(x) = lcm(m_1(x), \ldots, m_{\delta'-1}(x))$. Then compute the following:

$$p'(x) = p(x) \bmod g'(x) = a(x) \cdot x^{n-k} \bmod g'(x); \; q(x) = (p(x) - p'(x))/g'(x). \text{ and}$$

Please note that p'(x) is actually the parity of a zero-padded word and hence can be used for decoding by normal BCH algorithms. For reconstruction, $p(x) = q(x) \cdot g'(x) + p'(x)$ is computed, which will have the same errors as p' as long as q doesn't have any errors.

For distributing/sharing half of the parity bits the following approach may be used. First compute the parities $p_i(x)$ and their splits $p'_i(x)$, $q_i(x)$ for each of the G words $a_i$, $i=1, \ldots, G$. Then XOR all $q_i$ to get $Q = \oplus q_i$. Then encode this with a smaller BCH code to get additional parity bits P. Per word store $a_i$, $p_i$ and sometimes an extra parity bit $b_i$ for $a_i$ and $p_i$. Then distribute P, Q and sometimes an extra parity bit B for P and Q over the G words (appended to the end) as evenly as possible.

In an alternative splitting approach, p(x) may be split into pH(x) and pL(x) with $p(x) = pH(x) \cdot x^u + pL(x)$, with $u = deg(g')$ and then again compute $p'^{(x)} = p(x) \bmod g'(x) = pH(x) \cdot x^u \bmod g'(x) + pL(x)$. But now pH(x) would be stored and p(x) is reconstructed by computing $p(x) = pH(x) \cdot x^u + p'(x) + (pH(x) \cdot x^u \bmod g'(x))$. Then the distributing/sharing of the parity bits in the previous paragraph may be used with $pH_i(x)$ being stored instead of $q_i(x)$.

Now that the general encoding has been described, the details, especially for the decoding, will need further explanation.

First of all, it needs to be decided how large t' must be and if an extra parity bit (u=1) is needed. This is a simple function of t and s: for even t a value of $t' = \lfloor t/2 \rfloor + \lfloor s/2 \rfloor$ and $u = s \bmod 2$ is needed, and for odd t, a value of $t' = \lfloor t/2 \rfloor + \lceil s/2 \rceil$ and $u = s+1 \bmod 2$ is needed. For the encoding of Q a BCH code is used with a designed minimum distance $\Delta = 2 \cdot T + 1$ with $T = t - s - 1 - U$ and $U = (t+s+1) \bmod 2$ (or none if $T \leq 0$); U signals again if an extra parity bit B as described above is needed or not; for T=0 just a simple parity bit may be used.

So a word is read that has $e_i$ errors in $a_i$, $p_i$ (, $b_i$) and there are e errors in the complete group (all bits) and the word-BCH code indicates that it would correct e' errors. For an extended BCH code, if $b_i \neq (HW(a_i) + HW(p_i) + e_i) \bmod 2$, then set $e'_i := e'_i + 1$. So what could be seen and done with this approach? The following four cases may be considered.

In the first case, when t is even and u=0, then the word-BCH code has a minimum distance d' of at least $\delta' = 2t' + 1 = t + s + 1$.

In the second case, when t is even and u=1, the the extended word-BCH code (including the extra parity bit) has a minimum distance d' of at least $\delta' + 1 = 2t' + 2 = t + (s-1) + 2 = t + s + 1$.

In the third case, when t is odd and u=0, then the word-BCH code has a minimum distance d' of at least δ'=2t'+1=(t−1)+(s+1)+1=t+s+1.

In the fourth case, when t is odd and u=1, then the extended word-BCH code (including the extra parity bit) has a minimum distance d' of at least δ'+1=2t'+2=(t−1)+s+2=t+s+1.

This implies up to s errors may be corrected and up to t errors per word may be detected according to standard coding theory. This is the desired result. It will now be shown how this works. For $0 \le e_i \le t'$ the following results: $e'_i = e_i$. For $t' < e_i \le t$ the following results: $e'_i \ge d' - e_i \ge d' - t = s + 1 > s$. So if $e'_i \le s$, it may be assumed that $e_i = e'_i \le s$ and the (extended) word BCH code may be used to correct up to s errors; one error could also be in the extra parity bit, but might then simply be ignored. Otherwise, the complete group needs to be read. There can be only one word with more than $\lfloor t/2 \rfloor \le t'$ errors, because otherwise there would be at least $$2 \cdot (\lfloor t/2 \rfloor + 1) = 2\lfloor t/2 \rfloor + 2 \ge 2 \cdot \left(\frac{t}{2} - \frac{1}{2}\right) + 2 = t - 1 + 2 = t + 1$$

errors. If there is such a word, it will be the one with the largest value $e'_i$: Assume that $e'_1 \ge e'_2$, but $e_1 < e_2$. As above, for $0 \le e_i \le t'$ the following results: $e'_i = e_i$; and for $t' < e_i \le t$ the following results: $e'_i \ge d' - e_i$. So it may be assumed that $e_1 = e'_1$ and $e_2 > t'$ (otherwise $e_2 = e'_2 \le e'_1 = e_1$) and this results in $e_1 + e_2 \ge e'_1 + d' - e'_2 \ge d' \ge t + 1 > t$, which cannot be. So this means that all words (with at most $\lfloor t/2 \rfloor \le t'$ errors) may be corrected but one (the one with max $e'_i$). The remaining word has $e_i \ge e'_i > s$, because otherwise this word would have already been corrected. That means that in the shared parity there will be at most $t − (s+1) = T + U$ errors. If there are $T+1$ errors (for U=1), the extended BCH code would detect this and the word could be simply and directly corrected, because it only has $s+1=2t'+1−t \le t'$ errors (i.e., the first and third cases above, where t and s are both even or odd:

$$t' = \frac{t}{2} + \frac{s}{2} < \frac{2t}{2} = t);$$

otherwise the (at most) T errors in the shared parity first need to be corrected and the full word parity reconstructed to correct the $e_i$ errors in the word.

The following table, Table 1 illustrates some example numbers for typical sizes.

TABLE 1

| w/G | \multicolumn{10}{c}{t/s} |
|---|---|---|---|---|---|---|---|---|---|---|
|  | 1/0 | 2/0 | 2/1 | 3/0 | 3/1 | 3/2 | 4/0 | 4/1 | 4/2 | 4/3 |
| 128/4 | 3 | 11 | 11 | 16 | 19 | 19 | 23 | 24 | 27 | 27 |
| 128/8 | 2 | 10 | 10 | 13 | 18 | 18 | 20 | 21 | 26 | 26 |
| 64/4 | 3 | 9 | 10 | 14 | 16 | 17 | 21 | 21 | 23 | 24 |
| 64/8 | 2 | 8 | 9 | 11 | 15 | 16 | 18 | 18 | 22 | 23 |
| 32/4 | 3 | 8 | 9 | 13 | 14 | 15 | 18 | 19 | 20 | 21 |
| 32/8 | 2 | 7 | 8 | 10 | 13 | 14 | 15 | 16 | 19 | 20 |

The following table, Table 2 illustrates the values for t', u, T, and U for values of s and t.

TABLE 2

| t', u, T, U for s\t | 1 | 2 | 3 | 4 |
|---|---|---|---|---|
| 0 | 0, 1, 0, 0 | 1, 0, 0, 1 | 1, 1, 2, 0 | 2, 0, 2, 1 |
| 1 | 1, 0, [−2, 1] | 1, 1, 0, 0 | 2, 0, 0, 1 | 2, 1, 2, 0 |
| 2 | — | 2, 0, [−2, 1] | 2, 1, 0, 0 | 3, 0, 0, 1 |
| 3 | — | — | 3, 0, [−2, 1] | 3, 1, 0, 0 |
| 4 | — | — | — | 4, 0, [−2, 1] |

So about 3-11 bits are saved compared to straight forward t-bit error correction per word, depending on the options. Of course the coding method gets more efficient with larger words and/or groups and if s is kept at 0, 1 or 2. It can also be seen that in some cases increasing s by one does not increase the number of needed bits per word or only increase by one.

Of course a "logical" word could also be split/distributed over two or more physical words, e.g., instead of a 128/8;2/1 encoding with 10 extra bits per word would result in a 64/2×8;2/1 encoding with only 5 extra bits per word, compared to a 64/8;2/1 encoding with 9 extra bits per word.

As also explained in the examples, one could also just double read a word if any error is detected and/or add the addresses into the ECC, to get even more protection against fault attacks.

And for t'=1 the partitioning of the parity bits could be used, such that a Hamming code results if only one part of the parity bits may be obtained, but this only works to some specific lengths; e.g., for t=2 and m=8 (w≥128 bit), this approach may be used up to 165 bits (including parity bits), and for t=3 it may be used up to 164,166,164 bits if the first, second, or third 8-bit chunk is taken. For m=7 (w≥64 bit) and t=2, it is up to 82 bits and for t=3 up to 70,77,70 bits, so the second chunk of 7 bits need to be obtained here, which leaves a headroom of 6 bits. For m=6 (w≥32 bit) and t=2, it is up to 40 bit (2 bits headroom); for t=3 it is up to 40,32,40 bits, so the first or third 6-bit chunk need to be obtained. So this might be easier to implement in some cases, but at least does not change anything on the number of needed bits.

Figure 1:
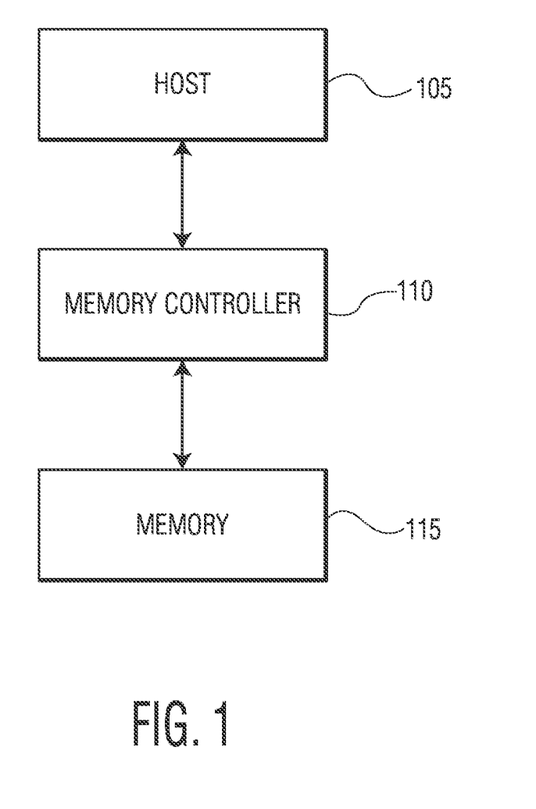
FIG. 1 illustrates a memory system using the coding method described herein.

FIG. 1 illustrates a memory system using the coding method described above. A host system 105 stores data in a memory 115. A memory controller 110 provides an interface between the host system 105 and the memory 115. The memory controller may implement the coding methods described above when storing and reading data from the memory 115. The use of the coding method by the memory controller 115 is transparent to both the host 105 and the memory 115. When the memory controller 110 stores data from the host system 105 in the memory 115, it groups data words and encodes them with parity bits, including shared parity bits, as described above. The parity bits provide the ability to detect and correct for a specified number of errors in the stored data when read. When the host system 105 reads data from the memory 115, it will do a parity check as described above that includes doing a word parity check and error correction, and then if needed a shared parity check and error correction by reading multiple words.

The host may be any type of computing system that uses memory. The memory may be any type of memory that may be used to store data. The memory may be external to the processor chip or system or may be integrated memory. The memory controller 110 and memory 115 may be separate devices implemented on integrated circuits or may be implemented in the same integrated circuit. Likewise, a processor in the host system may be a separate device from the memory controller 110 and memory 115, or they may be integrated in any combination on a single integrated circuit.

Figure 2:
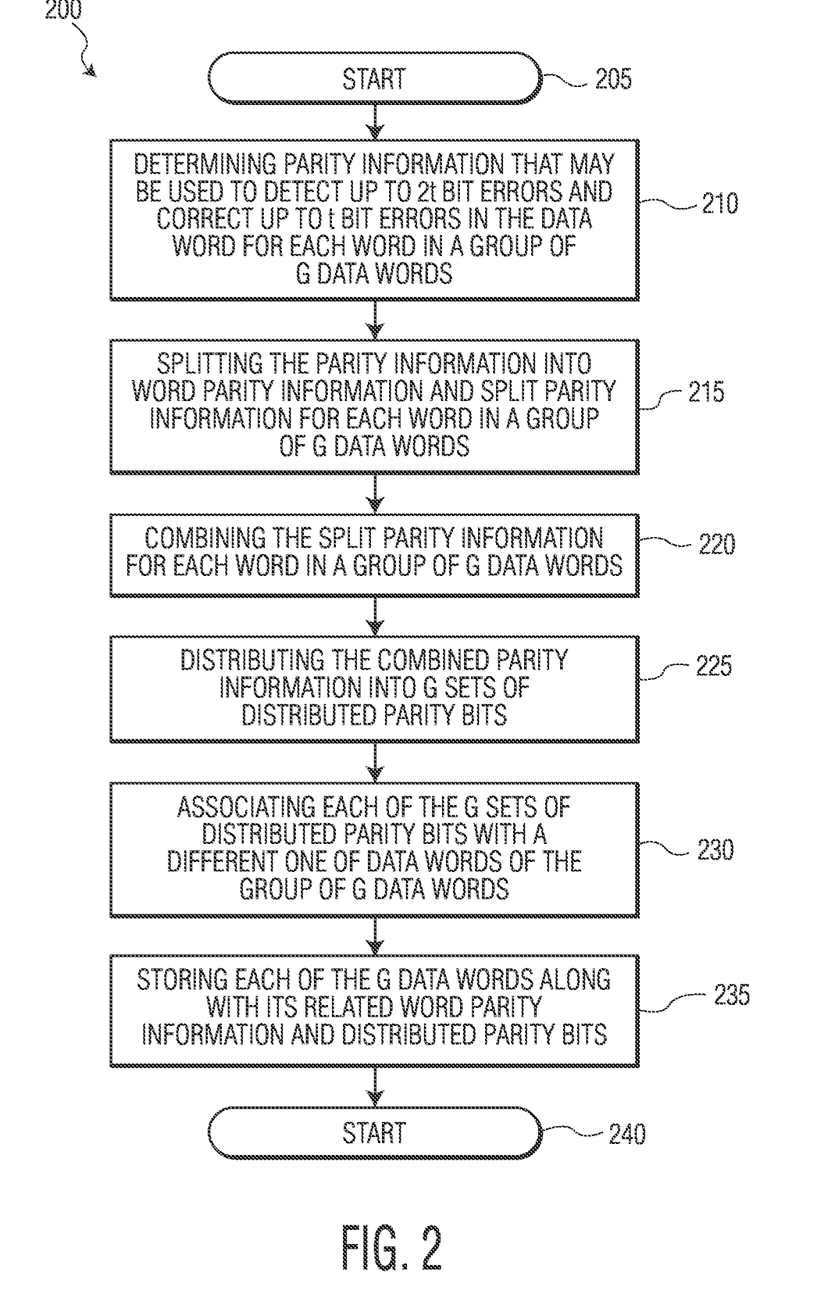
FIG. 2 illustrates one embodiment of a coding method for storing data in a memory.

FIG. 2 illustrates one embodiment of a coding method for storing data in a memory. The coding method 200 begins at 205 and then determines the parity information that may be used to detect up to 2t bit errors in the data word and correct up to t bit errors in the data word 210. Next the method 200 splits the parity information into word parity information and split parity information, wherein the word parity information may be used to detect or detect and correct errors in the data word 215. The coding method 200 also combines the split parity information of each of the G data words into combined parity information 220. Next, the coding method 200 distributes the combined parity information into G sets of distributed parity bits 225. The coding method 200 then associates each of the G sets of distributed parity bits with a different one of data words of the group of G data words 230. Finally, the coding method stores each of the G data words along with its related word parity information and distributed parity bits 235, and then ends at 240.

The coding method described herein allows for error detection and error correction to be reliably performed by spreading shared parity bits across a group of memory words. Further, each word has its own parity bits as well, so that certain errors can be corrected at the word level, and further errors can be detected and/or corrected across words when needed. This approach has two benefits. First, it allows for a smaller word size to be used in the memory to either reduce the area needed to implement the memory or to free up area to be used to carry other meta data associated with the stored data. Second, because of the two levels of detect/correction, i.e., at the word level and the word group level, many errors (i.e., the most common types of errors) can be handled at the word level, and only more complex errors (which are much rarer) and corrections will need to use the shared parity bits which requires reading more than one word and is associated with a decrease in performance. This leads to the increased ability to detect more complex errors with a minimal impact to throughput performance of the memory. As a result, the disclosed coding method and system provides a technological advancement over current memory systems and memory error detection and correction methods, but allowing for less storage overhead to detect and correct errors while reducing the impact of such methods on the memory throughput.

As used herein, the term "non-transitory machine-readable storage medium" will be understood to exclude a transitory propagation signal but to include all forms of volatile and non-volatile memory. When software is implemented on a processor, the combination of software and processor becomes a single specific machine. Although the various embodiments have been described in detail, it should be understood that the invention is capable of other embodiments and its details are capable of modifications in various obvious respects.

Because the data processing implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Any combination of specific software running on a processor to implement the embodiments of the invention, constitute a specific dedicated machine.

It should be appreciated by those skilled in the art that any block diagrams herein represent conceptual views of illustrative circuitry embodying the principles of the invention.

What is claimed is:

1. A method for storing data in a memory, comprising:
for each of group of G data words, where G is an integer:
determining parity information that may be used to detect up to 2t bit errors in the data word and correct up to t bit errors in the data word, where t is an integer; and
splitting the parity information into word parity information and split parity information, wherein the word parity information may be used to detect or detect and correct errors in the data word;
combining the split parity information of each of the G data words into combined parity information;
distributing the combined parity information into G sets of distributed parity bits;
associating each of the G sets of distributed parity bits with a different one of data words of the group of G data words; and
storing each of the G data words along with its related word parity information and distributed parity bits.

2. The method of claim 1, wherein word parity information includes an error detection bit and error correction bits.

3. The method of claim 1, wherein combining the split parity information for each of the G data words into combined parity information includes XORing the split parity information for each of the G data words.

4. A method for storing data in a memory that stores a group of G data words with w data-bits per data word, comprising:
generating a first generator polynomial $g(x)$;
for each of the plurality of G data words:
generating the first parity bits of the data word, wherein the first parity bits are the coefficients of a polynomial $p(x)$ and wherein the polynomial is based upon a polynomial $a(x)$ and the polynomial $g(x)$, wherein $a(x)$ is a binary polynomial with the coefficients being the data bits of the data word;

generating first split parity bits of the data word based upon p(x); and generating second split parity bits of the data word based upon the first parity bits and p(x);

combining the second parity bits for each word into Q;

distributing the bits of Q among the G data words; and storing the G data words in the memory, wherein each data word includes a(x), first parity bits, and distributed bits of Q.

5. The method of claim 4, further comprising
encoding Q into additional parity bits P; and
distributing the bits of P among the G data words,
wherein storing the G data words in the memory, includes the distributed bits of P.

6. The method of claim 5, further comprising determining a parity bit B for Q and P, where B is distributed with the bits of Q and P among the G data words.

7. The method of claim 4, further comprising determining extra parity information for each of the G data words based upon the data word and its associated parity information and wherein storing the G data words in the memory includes storing the extra parity information with the respective data word.

8. The method of claim 4, wherein $g(x) = lcm(m_1(x), \ldots, m_{\delta-1}(x))$, where $m_i$ is the minimal polynomial of $\alpha^i$ and $\alpha$ a primitive element in $GF(2^m)$, $\delta = 2 \cdot t + 1$, and t is the maximum number of correctable bit-errors in the group of G words, where $GF(2^m)$ is a finite field with $2^m$ elements where m is an integer.

9. The method of claim 8, wherein $p(x) = a(x) \cdot x^{n-k} \mod g(x)$, where n is the code length and k is n minus the degree of the polynomial g(x).

10. The method of claim 9, further comprising:
generating a second generator polynomial g'(x) that is based upon the first generator polynomial g(x) with a lesser degree;
wherein generating first split parity bits p'(x) of the data word is further based upon g'(x)
wherein generating second split parity bits q(x) of the data word is further based upon g'(x).

11. The method of claim 10, wherein $p'(x) = p(x) \mod g'(x) = a(x) \cdot x^{n-k} \mod g'(x)$, where $g'(x) = lcm(m_1(x), \ldots, m_{\delta'-1}(x))$, where $\delta' = 2 \cdot t' + 1$ and $t' \geq \lfloor t/2 \rfloor$.

12. The method of claim 11, wherein $q(x) = (p(x) - p'(x))/g'(x)$.

13. The method of claim 12, wherein combining q(x) for each word into Q includes XORing q(x) for each word into Q.

14. The method of claim 4, further comprising:
generating a second generator polynomial g'(x) that is based upon the first generator polynomial g(x) with a lesser degree;
wherein generating first split parity bits p'(x) of the data word is calculated as $p'(x) = pH(x) \cdot x^u \mod g'(x) + pL(x)$, where $p(x) = pH(x) \cdot x^u + pL(x)$, with $u = \deg(g')$, and
wherein the second split parity bits are pH(x).

15. The method of claim 4, wherein when t'=1, the first split parity bits result in a Hamming code if only one of the first split parity bits and the second split parity bits are available, where t' is the maximum number of errors that may be corrected by only using the first split parity bits.

* * * * *